United States Patent
Hause et al.

(10) Patent No.: US 6,255,215 B1
(45) Date of Patent: Jul. 3, 2001

(54) SEMICONDUCTOR DEVICE HAVING SILICIDE LAYERS FORMED USING A COLLIMATED METAL LAYER

(75) Inventors: Fred Hause; Charles E. May; William S. Brennan, all of Austin, TX (US)

(73) Assignee: Advanced Micro Services, Sunnyvale, CA (US)

( * ) Notice: Subject to any disclaimer, the term of this patent is extended or adjusted under 35 U.S.C. 154(b) by 0 days.

(21) Appl. No.: 09/175,652

(22) Filed: Oct. 20, 1998

(51) Int. Cl.[7] .................................................. H01L 21/44
(52) U.S. Cl. ......................... 438/682; 438/664; 438/683
(58) Field of Search ..................................... 438/151, 663, 438/664, 682, 683, 684

(56) References Cited

U.S. PATENT DOCUMENTS

| | | | |
|---|---|---|---|
| 5,529,958 | * 6/1996 | Yaoita | 437/200 |
| 5,565,383 | * 10/1996 | Sakai | 437/200 |
| 5,635,036 | 6/1997 | Demaray et al. | |
| 5,702,573 | * 12/1997 | Biberger et al. | 204/192.12 |
| 5,814,537 | * 9/1998 | Maa et al. | 438/151 |
| 6,004,849 | * 12/1999 | Gardner et al. | 438/286 |

OTHER PUBLICATIONS

"Silicon Processing for the VLSI Era vol. 2—Process Integration" S. Wolf, Lattice Press, Sunset Beach California, 1990, pp. 144–152.*

* cited by examiner

*Primary Examiner*—Richard Elms
*Assistant Examiner*—Brad Smith

(57) ABSTRACT

A process for forming a silicide layer using a metal layer formed by collimated deposition is provided. The collimated metal layer may, for example, be formed by sputtering metal particles and filtering the metal particles prior to forming the metal layer. By depositing metal in this manner, the resistance of the resultant metal silicide layer can be reduced as compared to metal silicide layers formed using conventional techniques. Lower silicidation reaction temperatures may also be employed.

23 Claims, 2 Drawing Sheets

SEMICONDUCTOR DEVICE HAVING SILICIDE LAYERS FORMED USING A COLLIMATED METAL LAYER

FIELD OF THE INVENTION

The present invention is generally directed to semiconductor devices and, more particularly, to the fabrication of silicide layers using a metal layer formed by collimated deposition.

BACKGROUND OF THE INVENTION

Over the last few decades, the electronics industry has undergone a revolution by the use of semiconductor technology to fabricate small, highly integrated electronic regions. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, BiCMOS transistors, etc.

Each of these semiconductor devices generally include a semiconductor substrate on which a number of transistors are formed. The particular structure of a given transistor can vary between transistor types. For example, MOS transistors generally include source and drain regions and a gate electrode which modulates current between the source and drain regions. Bipolar transistors generally include a base, a collector, and an emitter. In addition to these active regions (e.g., source regions, drain regions, gate electrodes, bases, emitters, collectors, etc.) of the transistors, both bipolar and MOS transistors often include polysilicon lines, active regions which typically run over regions of the substrate, such as field oxide regions, and interconnect various portions of the region.

The various active regions on a semiconductor device are typically interconnected by metal lines. In most cases, a silicide or silicidation layer is formed over some or all of the active regions in order to facilitate contact between the active regions and subsequent metal lines. The silicide layers also serve to reduce the sheet resistance of the active regions. Silicide layers are typically formed by depositing, usually by physical or chemical vapor deposition, a layer of metal, such as tungsten, platinum, cobalt or titanium, over a substrate and annealing the substrate, typically in a two-step process. During the annealing process, the deposited metal reacts with underlying silicon and forms a metal silicide layer.

The resistivity and diffusion rate of the silicide layers of a semiconductor device substantially impacts device performance. Operating speeds of a semiconductor, in particular, decrease as the resistivity of a silicide layer increases. Semiconductor manufacturers consequently continually seek to reduce the resistivity and grain morphology of silicide layers used in semiconductors and find processes which reduce silicide resistance extremely beneficial.

SUMMARY OF THE INVENTION

The present invention provides a process for forming a silicide layer using a collimated metal layer. By using a collimated metal layer, the resistance of the resultant metal silicide layer can be reduced as compared to metal silicide layers formed using conventional techniques. A semiconductor fabrication process, in accordance with one embodiment of the invention, includes depositing a collimated metal layer over a silicon active region and reacting the collimated metal layer with the silicon active region to form a metal silicide on the silicon active region.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
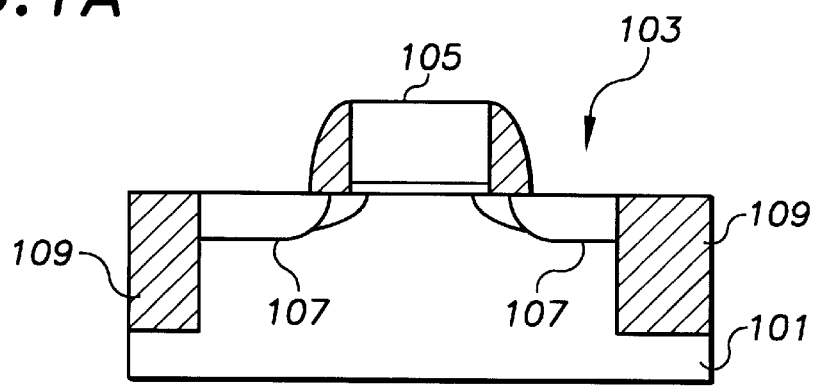
FIGS. 1A–1C Illustrate an exemplary fabrication process in accordance with an embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices, including MOS, CMOS, BiCMOS, and bipolar devices, which use silicide layers on active regions. The invention has been found to be particularly advantageous in applications where it is desirable to form low resistivity silicide layers. While the present invention is not so limited, an appreciation of various aspects of the invention is best gained through a discussion of various application examples of processes used to form such semiconductor devices.

As discussed above, semiconductor devices typically include silicon active regions (e.g., source/drain regions, emitters, bases, collectors, gate electrodes, polysilicon lines, etc.) on which silicide layers are formed. The silicide layers are typically formed to facilitate contact to the active region and to lower the resistivity of the contact. The present invention can be used to form silicide layers over any type of silicon active regions. By way of illustration, the formation of silicide layers over a gate electrode and adjacent source/drain regions will be illustrated below.

Figure 1B:
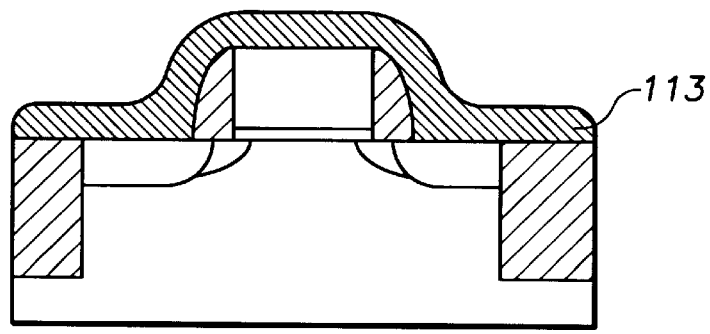
Figure 1C:
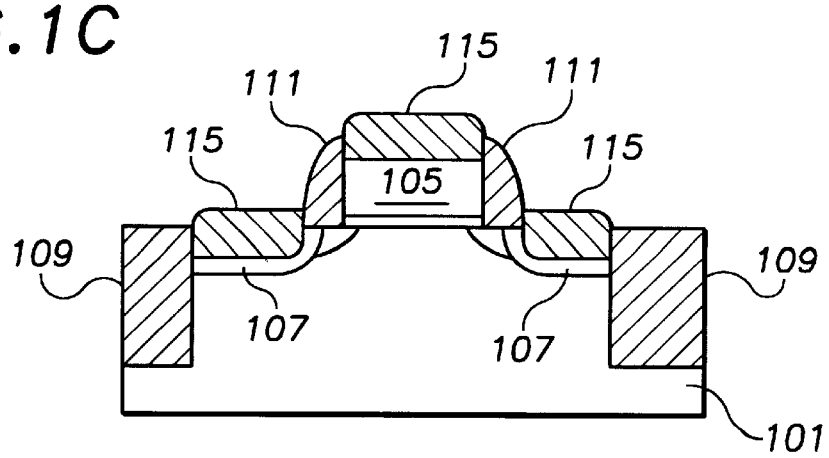

FIGS 1A–1C illustrate an exemplary process for forming a metal silicide layer using collimated deposition of metal. In accordance with this exemplary embodiment, one or more transistors (only one of which is shown) are formed over a silicon substrate 101. The resultant structure is illustrated in FIG. 1A. The transistor 103 typically includes a polysilicon gate electrode 105 and source/drain regions 107 in the substrate 101 adjacent the polysilicon gate electrode 105. The transistor 103 can be formed using any of a number of well-known techniques and may be isolated by field regions 109.

A metal layer 113 is deposited over the substrate 101 using collimated deposition, as illustrated in FIG. 1B. Prior to depositing the metal layer 113, any native oxide growth on the gate electrode 105 and/or source/drain regions 107 may be removed using, for example, a hydrofluoric acid (HF) dip. The substrate 101 (and layers thereon) may also be degassed before depositing the metal layer 113. Degassing may, for example, be carried out under vacuum at a temperature between 200° C. and 450° C. for 10 to 60 seconds. This may be performed in-situ with the deposition system used for depositing the collimated metal layer 113.

The term "collimated deposition" is intended to cover any type of deposition process in which the angle at which the metal impacts the substrate is limited. The collimated metal layer 113 will be reacted with exposed silicon areas (e.g., exposed surfaces of the gate electrode 105 and source/drain regions 107) to form metal silicide layers over each of these active regions. The metal layer 113 may be formed from a number of different metals including, in particular, titanium. The thickness of the metal layer is suitably selected in consideration of the desired thickness of the silicide layers, taking into account source/drain junction depths and gate electrode-source/drain spacing. Collimated metal layer thicknesses ranging from about 50 to 500 angstroms (Å) would be suitable for many applications.

Figure 2:
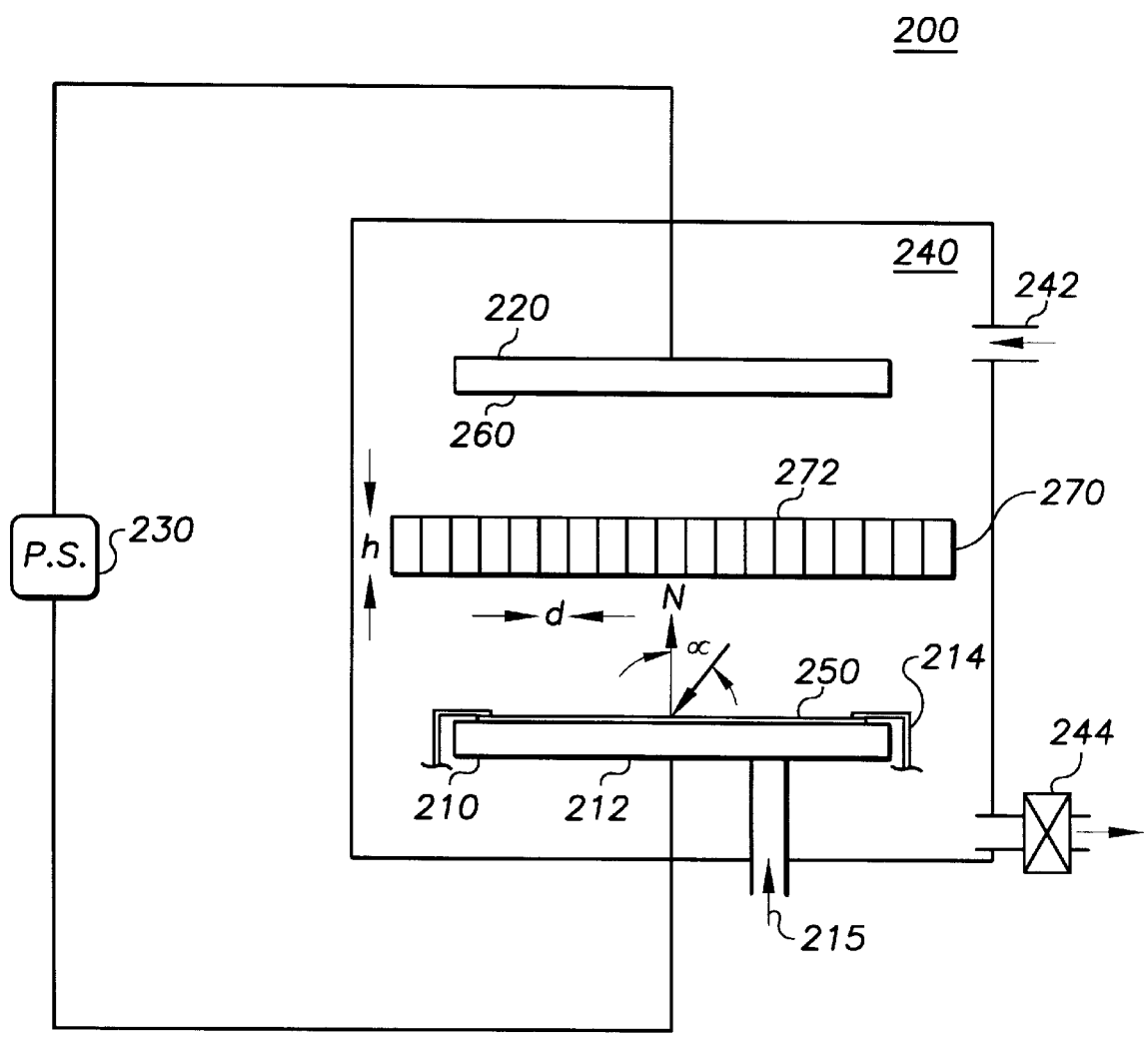
FIG. 2 is a schematic diagram of an exemplary collimated deposition apparatus in accordance with one embodiment of the invention.

The collimated metal layer 113 is generally formed by limiting the angle at which metal particles (e.g., atoms and/or clusters of atoms) impact the substrate 101. This may be done using, for example, a collimator or filter between the substrate 101 and the source of the metal particles (e.g., a metal target). An exemplary system which uses, by way of example, sputtered metal deposition to form the collimated metal layer 113 is schematically illustrated in FIG. 2. The system 200 includes a sputtering chamber 240, such as a parallel plate plasma sputtering chamber, having an anode 210 and a cathode 220 coupled to a DC power supply 230 (e.g., 3–12 kW). In the illustrated embodiment, the anode 210 is a platform or chuck 212. During deposition, the substrate 250 may be held against the chuck 212 or may be pressed against clamps 214 using a backside gas 215, as in the illustrated embodiment. The chuck 212 typically includes a heating element for heating the substrate 250. In other embodiments, the substrate 250 may itself form the anode 210. The cathode 220 is typically rotatable and magnetic. A metal target 260 formed from the metal to be deposited may form the cathode 220 or may be mounted on the cathode 220. The system 200 further includes a gas inlet 242 for supplying an inert gas such as argon into the chamber 240 and a gas outlet coupled to a pump (e.g., a cryopump) 244 for exhausting gas and maintaining the pressure of the chamber 240.

The apparatus 200 further includes a collimating filter 270, disposed between the target 260 and the semiconductor substrate 250, for limiting the angle of incidence at which sputtered metal particles from the target 260 impact with the substrate 250. The collimating filter 270 may, for example, be formed from aluminum, titanium, or stainless steel and may be coated with aluminum oxide, if desired. The collimating filter 270 typically includes a plurality of cells 272 each of which have an aspect ratio, i.e. a height (h) to diameter (d) ratio, which sufficiently limits the angle of incidence of the sputtered metal particles. The characteristics of the collimating filter 270, such as its aspect ratio, its location relative to the target 260 and substrate 250, the size and shape of its cells, and its material, can vary. For many applications, the cells may be circular or hexagonal in cross-section and have an aspect ratio ranging from 1:1 to 3:1. At these aspect ratios, the maximum incidence angle a relative to a normal axis N of the substrate 101 of metal particles ranges from about ±45° to ±20°. In one particular embodiment the cells have an aspect ratio of 1.25:1, thereby providing a maximum angle of incidence a of about ±38°.

In operation, a sufficient voltage is applied across the electrodes 210 and 220 to form a plasma from the inert gas. Once the plasma is formed, ions in the plasma accelerate toward the target 260 and knock off or sputter metal particles, such as atoms or atom clusters, from the target 260. The sputtering process may be carried out using known techniques. The metal particles pass through the collimating filter 270 and deposit on the substrate 250 to form a collimated metal layer (e.g., layer 113). The chamber conditions during the collimated deposition process can vary from application to application and chamber to chamber. For many applications, the chamber pressure and chuck temperature are, respectively, maintained between about 2 and 15 milliTorr and between about 0° C. and 350° C. during deposition. The chamber base pressure (i.e., chamber pressure while not depositing) may be about $3 \times 10^{-8}$ (3E–8) Torr.

By limiting the angle of incidence of the deposited metal, the resultant metal layer is typically associated with higher density and tighter crystal orientation as compared to conventionally deposited metal layers. When using titanium, for example, the collimated metal layer may have a smaller grain size (e.g., ranging from about 0.05 to 0.2 microns) as compared to conventional depositions (grain size typically from about 0.1 to 0.5 microns). This enables a more thorough reaction with the underlying silicon, which can significantly reduce the sheet resistance of the resultant silicide layer and/or reduce the temperature needed to carry out the silicidation reaction.

The substrate 101 is annealed to react the metal layer 113 with exposed silicon, including polysilicon, regions and form silicide layers 115 on the gate electrode 105 and source/drain regions 107. A silicide does not form over other regions, such as spacers 111 and field regions 109. The characteristics of the anneal can vary depending on, for example, the type and thickness of metal being used. With titanium layers having a thickness of 250 to 500 angstroms, suitable anneals include rapid thermal anneals at temperatures from 600° C. to 750° C. for 10 to 60 seconds. Unreacted portions of the metal layer 113 are then removed using, for example well-known etching techniques based on the type of metal used. Following the removal of unreacted metal layer portions, the substrate 101 is annealed again, at typically a higher temperature, in order to further reduce the resistivity of the silicide layers 115. Again the anneal characteristics can vary. With titanium, suitable second anneals include rapid thermal anneals at temperatures from 700° C. to 900° C. for 10 to 30 seconds. The resultant structure is illustrated in FIG. 1C. Fabrication may then continue with conventional fabrication steps, such as interconnect formation and so forth, to form the ultimate device structure.

Using the above process, the resistance of metal silicide layers can be reduced as compared to metal silicide layers formed using conventional metal deposition techniques. Using titanium, in particular, titanium silicide layers have sheet resistances less than 4 ohms/cm$^2$ and as low as 2 ohms/cm$^2$ may be form using the above process. In comparison, silicide layers formed from plasma vapor deposited titanium without collimation typically have sheet resistances of about 8–12 ohms/cm$^2$. The lower resistivity silicide layers can, for example, advantageously increase the operating speeds of the resultant semiconductor device. In addition, the smaller grain size of the deposited metal is particularly beneficial when used with smaller silicon features (e.g., gate electrode widths of 0.25 microns or less). In these cases, the smaller grain size allows more grains of metal to span the silicon features, thereby reducing the resistivity of the resultant silicide layers. Moreover, for similar anneal temperatures, the above process provides lower resistivity silicide layers than conventional processes. This allows for reductions of anneal temperature without degrading silicide layer resistivity. Lower annealing temperatures may be useful in applications which would benefit from a lower thermal budget.

As noted above, the present invention is applicable to fabrication of silicide layers on a number of different active regions. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and regions.

What is claimed is:

1. A process of fabricating a semiconductor device, the process comprising:
   arranging a filter over and spaced above the device;
   depositing a collimated metal layer over a silicon active region of a substrates and using the filter to filter the metal particles being deposited; and
   reacting the collimated metal layer with the silicon active region to form a metal silicide layer on the silicon active region.

2. The process of claim 1, wherein filtering the metal particles includes limiting an incidence angle of the metal particles to between 0° and ±45° relative to a normal axis of the substrate.

3. The process of claim 1, wherein filtering metal particles includes passing the metal particles though cells having an aspect ratio ranging from 1:1 to 3:1.

4. The process of claim 1, wherein depositing the collimated metal layer includes sputtering the metal particles from a target.

5. The process of claim 1, wherein reacting the metal layer with the silicon active regions includes:
   annealing the substrate at a first temperature to form the metal silicide layer;
   removing any unreacted portions of the metal layer; and
   annealing the substrate at a second temperature greater than the first temperature to reduce the resistivity of the metal silicide layer.

6. The process of claim 5, wherein the first temperature ranges from about 600 to 750° C.

7. The process of claim 7, wherein the second temperature ranges from about 700 to 900° C.

8. The process of claim 8, wherein the metal layer is formed from titanium and the metal silicide layer is a titanium silicide having a sheet resistance less than 8 ohms/cm$^2$.

9. The process of claim 9, wherein the titanium silicide has a sheet resistance less than 4 ohms/cm$^2$.

10. The process of claim 1, wherein the silicon active region is a source/drain region.

11. The process of claim 1, wherein the silicon active region is a polysilicon structure formed over the substrate.

12. A process of fabricating a semiconductor device, comprising:
    forming a polysilicon gate electrode over a silicon substrate;
    forming a source/drain region in the substrate adjacent the gate electrode;
    arranging a filter over and spaced above the device;
    depositing a layer of metal over the gate electrode and source/drain region by limiting the angle of incidence at which the metal impacts the substrate with the filter; and
    reacting the metal layer with the gate electrode and a portion of the substrate including the source/drain region to form metal silicide layers on the gate electrode and the source/drain region.

13. The process of claim 12, wherein filtering the metal particles includes limiting the angle of incidence of the metal particles to between 0° and ±45° relative to a normal axis of the substrate.

14. A process of fabricating a silicide layer for a semiconductor device, comprising:
    forming one or more silicon active regions on a substrate;
    arranging a filter over and spaced above the device;
    sputter depositing metal particles through the filter and forming a metal layer on the one or more silicon active regions; and
    reacting the metal layer with the silicon active regions to form metal silicide layers on the silicon active regions.

15. The process of claim 14, wherein forming the metal layer includes sputter depositing titanium.

16. The process of claim 15, wherein reacting the metal layer with the silicon active regions to form metal silicide layers includes:
    annealing the substrate at a first temperature to form the metal silicide layer removing any unreacted portions of the metal layer; and
    annealing the substrate at a second temperature greater than the first temperature to reduce the resistivity of the metal silicide layer.

17. The process of claim 16, wherein the first temperature ranges from about 700 to 750° C. and the second temperature ranges from about 800 to 850° C.

18. The process of claim 17, wherein the metal silicide layer is a titanium silicide having a sheet resistance less than 4 ohms/cm$^2$.

19. The process of claim 15, wherein forming the metal layer includes maintaining the pressure of a deposition chamber between about 2 and about 15 milliTorr.

20. The process of claim 15, wherein forming the metal layer includes maintaining the temperature of a chuck between about 0° C. and about 350° C.

21. A process of fabricating a silicide layer for a semiconductor device, comprising:

forming one or more silicon active regions on a substrate;

forming a metal layer over the silicon active regions by sputter depositing metal particles, including titanium, and filtering the metal particles with a filter arranged over and spaced above the device prior to forming the metal layer, wherein the titanium is deposited to a thickness ranging from about 50 to about 500 angstroms; and reacting the metal layer with the silicon active regions to form metal silicide layers on the silicon active regions.

22. A process of fabricating a silicide layer for a semiconductor device, comprising:

forming one or more silicon active regions on a substrate;

forming a metal layer over the silicon active regions by sputter depositing metal particles, including titanium, and filtering the metal particles with a filter arranged over and spaced above the device prior to forming the metal layer, wherein titanium is deposited with a grain size ranging from about 0.05 to about 0.2 microns; and reacting the metal layer with the silicon active regions to form metal silicide layers on the silicon active regions.

23. A process of fabricating a silicide layer for a semiconductor device, comprising:

forming one or more silicon active regions on a substrate;

forming a metal layer over the silicon active regions by sputter depositing metal particles, including titanium, using a filter arranged over and spaced above the device to filter the metal particles;

reacting the metal layer with the silicon active regions to form metal silicide layers on the silicon active regions wherein the titanium is deposited with at least one of: a thickness ranging from about 50 to about 500 angstroms, and a grain size ranging from about 0.05 to about 0.2 microns.

* * * * *

UNITED STATES PATENT AND TRADEMARK OFFICE
CERTIFICATE OF CORRECTION

PATENT NO. : 6,255,215 B1  
DATED : July 3, 2001  
INVENTOR(S) : Hause et al.

Page 1 of 1

It is certified that error appears in the above-identified patent and that said Letters Patent is hereby corrected as shown below:

<u>Title page,</u>  
The Assignee's name should read -- Advanced Micro Devices".

<u>Column 5,</u>  
Line 50, "substrates" should read -- substrate --.

<u>Column 7,</u>  
Line 20, after "and", please start a new paragraph with "reacting".

Signed and Sealed this

Sixteenth Day of April, 2002

Attest:

JAMES E. ROGAN  
*Attesting Officer*  *Director of the United States Patent and Trademark Office*